United States Patent
Miglani et al.

(10) Patent No.: US 9,853,657 B2
(45) Date of Patent: *Dec. 26, 2017

(54) DELTA SIGMA MODULATOR WITH DYNAMIC ERROR CANCELLATION

(71) Applicant: TEXAS INSTRUMENTS INCORPORATED, Dallas, TX (US)

(72) Inventors: Eeshan Miglani, Chhindwara (IN); Karthikeyan Gunasekaran, Chennai (IN); Santhosh Kumar Gowdhaman, Bangalore (IN); Shagun Dusad, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/489,124

(22) Filed: Apr. 17, 2017

(65) Prior Publication Data

US 2017/0222658 A1    Aug. 3, 2017

Related U.S. Application Data

(63) Continuation of application No. 15/226,436, filed on Aug. 2, 2016, now Pat. No. 9,660,665.

(30) Foreign Application Priority Data

Aug. 6, 2015    (IN) .......................... 4089/CHE/2015

(51) Int. Cl.
*H03M 3/00* (2006.01)
*H03M 1/06* (2006.01)
(Continued)

(52) U.S. Cl.
CPC ............. *H03M 3/50* (2013.01); *H03M 1/001* (2013.01); *H03M 1/0626* (2013.01);
(Continued)

(58) Field of Classification Search
CPC ............ H03M 3/30; H03M 1/12; H03M 1/00; H03M 1/747
(Continued)

(56) References Cited

U.S. PATENT DOCUMENTS 9,660,665 B2 * 5/2017 Miglani .................. H03M 3/50
2016/0126973 A1    5/2016 Mitani et al.

* cited by examiner

*Primary Examiner* — Joseph Lauture
(74) *Attorney, Agent, or Firm* — John R. Pessetto; Charles A. Brill; Frank D. Cimino

(57) ABSTRACT

The disclosure provides a delta sigma modulator that includes a first input port and a second input port. These ports receive a differential input signal. A DAC is coupled to the first input port and the second input port, and receives a differential feedback signal and a plurality of selection signals. A loop filter generates a differential filtered signal in response to a differential error signal. The differential error signal is proportional to a difference in the differential input signal and the differential feedback signal. A quantizer generates a quantized output signal in response to the differential filtered signal. A modified DWA block coupled between the quantizer and the DAC, generates the plurality of selection signals in response to a chop clock, a regular clock, the quantized output signal and a plurality of selection index signals. A selection index signal is dependent on previously generated plurality of selection signals.

18 Claims, 7 Drawing Sheets

(51) Int. Cl.
  *H03M 1/00* (2006.01)
  *H03M 1/74* (2006.01)
  *H03M 7/30* (2006.01)
  *H03M 1/12* (2006.01)

(52) U.S. Cl.
  CPC ......... *H03M 1/0665* (2013.01); *H03M 1/747* (2013.01); *H03M 3/34* (2013.01); *H03M 3/422* (2013.01); *H03M 3/458* (2013.01); *H03M 7/3004* (2013.01); H03M 1/00 (2013.01); H03M 1/12 (2013.01); H03M 3/30 (2013.01)

(58) Field of Classification Search
  USPC ................ 341/143, 155, 156, 150, 144, 153
  See application file for complete search history.

DELTA SIGMA MODULATOR WITH DYNAMIC ERROR CANCELLATION

CROSS REFERENCES TO RELATED APPLICATIONS

This application is a continuation of U.S. patent application Ser. No. 15/226,436, filed Aug. 2, 2016, which claims priority from India provisional patent application No. 4089/CHE/2015 filed on Aug. 6, 2015, all of which are hereby incorporated by reference in their entirety.

TECHNICAL FIELD

The disclosure relates to Delta Sigma Modulator (DSM) and more particularly to use of a modified data weighted averaging (DWA) block in the Delta Sigma Modulator (DSM).

BACKGROUND

Most electrical systems are digital today and hence require analog-to-digital converters (ADCs) to interface to the outside world. The outside world can either be real world signals such as temperature, pressure, voice, etc., or modulated carriers transmitting information over some medium (analog or digital communication). For all applications, energy efficiency is extremely important and more so for battery operated systems.

Delta sigma modulators are widely used for high resolution, low speed ADCs as well as for medium resolution, high speed ADCs. Delta sigma modulators have high dynamic range which makes them robust for communication and signal processing areas. It is important to use a multi-bit delta sigma modulator to fulfill demand for higher resolution, wider bandwidth and low quantization noise power. A digital to analog converter (DAC) is used in a feedback path of the delta sigma modulator. The DAC includes multiple DAC elements. A major drawback of the multi-bit delta sigma modulator is non-linearity stemming from the mismatching between the DAC elements.

DAC glitches and finite rise and fall time results in erroneous integration of a pulse generated by DAC in a continuous time delta sigma modulator. This error in DAC is known as dynamic error of DAC. The dynamic error of DAC limits the performance of the delta sigma modulator by increasing noise and non-linearity. Methods are known to reduce the impact of DAC mismatch errors on performance of delta sigma modulators, but methods to reduce impact of dynamic error of DAC on the performance of delta sigma modulator are non-existent.

SUMMARY

An embodiment provides a delta sigma modulator that includes a first input port and a second input port. These ports receive a differential input signal. A DAC is coupled to the first input port and the second input port, and receives a differential feedback signal and a plurality of selection signals. A loop filter generates a differential filtered signal in response to a differential error signal. The differential error signal is proportional to a difference in the differential input signal and the differential feedback signal. A quantizer generates a quantized output signal in response to the differential filtered signal. A modified DWA block coupled between the quantizer and the DAC, generates the plurality of selection signals in response to a chop clock, a regular clock, the quantized output signal and a plurality of selection index signals. A selection index signal is dependent on previously generated plurality of selection signals.

BRIEF DESCRIPTION OF THE VIEWS OF DRAWINGS

DETAILED DESCRIPTION OF THE EMBODIMENTS

Figure 1:
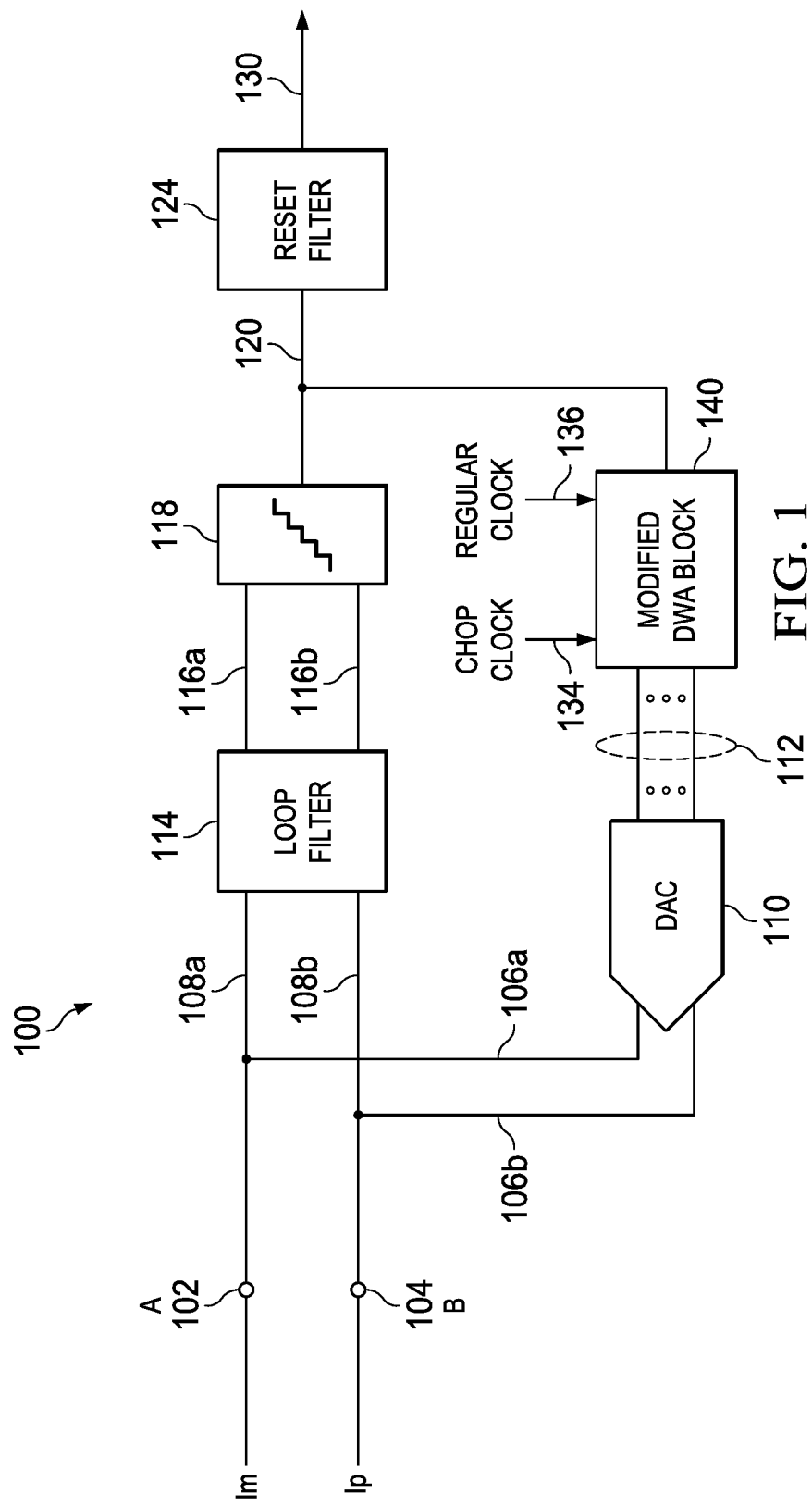
FIG. 1 is a block diagram of a delta sigma modulator, according to an embodiment.

FIG. 1 is a block diagram of a delta sigma modulator 100, according to an embodiment. The delta sigma modulator 100 includes a first input port A 102 and a second input port B 104. The delta sigma modulator 100 also includes a digital to analog converter (DAC) 110, a loop filter 114, a quantizer 118, a reset filter 124 and a modified data weighted averaging (DWA) block 140. The first input port A 102 and the second input port B 104 receives a differential input signal illustrated as Im and Ip.

The DAC 110 is coupled to the first input port A 102 and the second input port B 104. The loop filter 114 is coupled to the first input port A 102 and the second input port B 104. The quantizer 118 is coupled to the loop filter 114. The reset filter 124 is coupled to the quantizer 118. The modified DWA block 140 is coupled between the quantizer 118 and the DAC 110. The modified DWA block 140 receives a chop clock 134 and a regular clock 136. The delta sigma modulator 100 may include one or more additional components known to those skilled in the relevant art and are not discussed here for simplicity of the description.

The operation of the delta sigma modulator 100 illustrated in FIG. 1 is explained now. The differential input signal illustrated as Im and Ip is received at the first input port A 102 and the second input port B 104. The DAC 110 receives a differential feedback signal illustrated as 106a and 106b from the first input port A 102 and the second input port B 104. The DAC 110 also receives a plurality of selection signals 112. The DAC 110 includes a plurality of DAC elements. Each DAC element of the plurality of DAC elements receives a selection signal of the plurality of selection signals. The loop filter 114 receives a differential error signal illustrated as 108a and 108b. In one example, the differential error signal 108a and 108b is proportional to a difference in the differential input signal Im and Ip and the differential feedback signal 106a and 106b.

The loop filter 114 generates a differential filtered signal illustrated as 116a and 116b in response to the differential error signal 108a and 108b. The quantizer 118 generates a quantized output signal 120 in response to the differential filtered signal 116a and 116b. A plurality of filter coefficients is associated with the reset filter 124. The reset filter 124 generates a digital output signal 130 in response to the quantized output signal 120 and the plurality of filter coefficients.

The modified data weighted averaging (DWA) block 140 generates the plurality of selection signals 112 in response to the chop clock 134, the regular clock 136, the quantized output signal 120 and a plurality of selection index signals. A selection index signal of the plurality of selection index signals is dependent on previously generated plurality of selection signals. The previously generated plurality of selection signals are generated in a previous state of the regular clock 136. In one example, when the modified DWA block 140 generates the plurality of selection signals 112 at Nth interval of the regular clock 136, the selection index signal, used for generating the plurality of selection signals 112 at the Nth interval, is dependent on the plurality of selection signals generated at (N−1)th interval of the regular clock 136.

The chop clock 134 has two phases, a positive phase and a negative phase. In one version, the modified DWA block 140 tends to make transitions of all DAC elements, in the DAC 110, equal in the two phases of the chop clock 134. Thus, by using the chop clock 134, the modified DWA block 140 can keep a count of a number of transitions in each DAC element in the two phases of the chop clock 134. Using current state of the chop clock 134 and the count of the number of transitions, the modified DWA block 140 is able to determine if a DAC element has high or low affinity for switching. This affinity for switching along with a previously generated selection signal is used to determine if the DAC element has affinity to be activated or inactivated.

Figure 2:
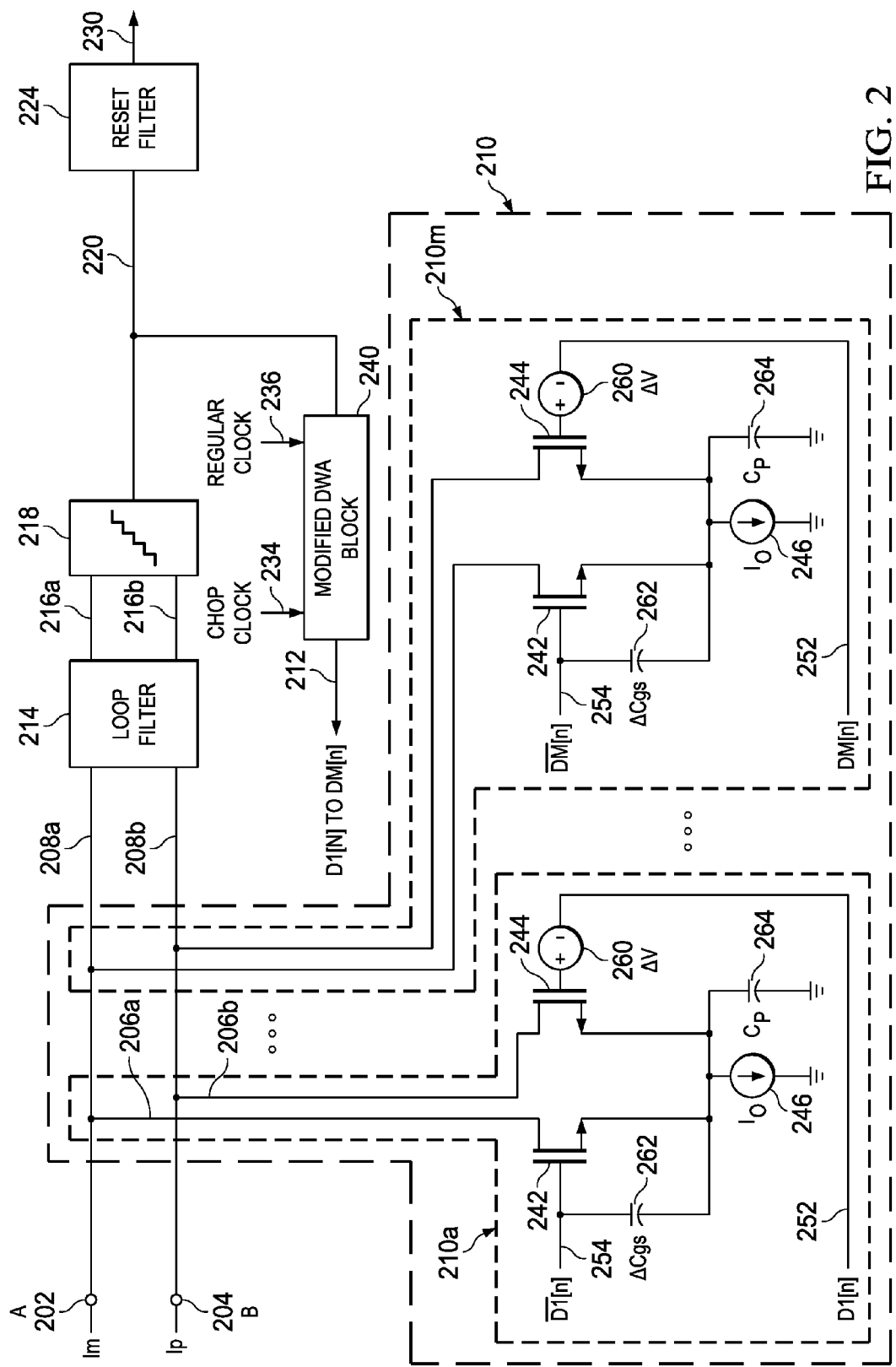
FIG. 2 is a block diagram of a delta sigma modulator, according to another embodiment.

FIG. 2 is a block diagram of a delta sigma modulator 200, according to another embodiment. The delta sigma modulator 200 includes a first input port A 202 and a second input port B 204. The delta sigma modulator 200 also includes a digital to analog converter (DAC) 210, a loop filter 214, a quantizer 218, a reset filter 224 and a modified DWA block 240. The first input port A 202 and the second input port B 204 receives a differential input signal illustrated as Im and Ip.

The DAC 210 is coupled to the first input port A 202 and the second input port B 204. The loop filter 214 is coupled to the first input port A 202 and the second input port B 204. The quantizer 218 is coupled to the loop filter 214. The reset filter 224 is coupled to the quantizer 218. The modified DWA block 240 is coupled between the quantizer 218 and the DAC 210. The modified DWA block 240 receives a chop clock 234 and a regular clock 236. The delta sigma modulator 200 may include one or more additional components known to those skilled in the relevant art and are not discussed here for simplicity of the description.

The operation of the delta sigma modulator 200 illustrated in FIG. 1 is explained now. The differential input signal illustrated as Im and Ip is received at the first input port A 202 and the second input port B 204. The DAC 210 includes a plurality of DAC elements illustrated as 210a to 210m. Each DAC element of the plurality of DAC elements receives a differential feedback signal. For example, the DAC element 210a receives the differential feedback signal illustrated as 206a and 206b.

The DAC 210 also receives a plurality of selection signals D1[n] to DM[n] 212. Each DAC element of the plurality of DAC elements receives a selection signal of the plurality of selection signals. For example, the DAC element 210 receives the selection signal D1[n] 254 and also receives an inverted selection signal $\overline{D1[n]}$ 252. A logic of the selection signal D1[n] 254 is inverted to generate the inverted selection signal $\overline{D1[n]}$ 252.

The loop filter 214 receives a differential error signal illustrated as 208a and 208b. In one example, the differential error signal 208a and 208b is proportional to a difference in the differential input signal Im and Ip and the differential feedback signal 206a and 206b. The loop filter 214 generates a differential filtered signal illustrated as 216a and 216b in response to the differential error signal 208a and 208b. The quantizer 218 generates a quantized output signal 220 in response to the differential filtered signal 216a and 216b. A plurality of filter coefficients is associated with the reset filter 224. The reset filter 224 generates a digital output signal 230 in response to the quantized output signal 220 and the plurality of filter coefficients.

The modified data weighted averaging (DWA) block 240 generates the plurality of selection signals D1[n] to DM[n] 212 in response to the chop clock 234, the regular clock 236, the quantized output signal 220 and a plurality of selection index signals. A selection index signal of the plurality of selection index signals is dependent on previously generated plurality of selection signals. The previously generated plurality of selection signals are generated in a previous state of the regular clock 236. In one example, when the modified DWA block 240 generates the plurality of selection signals D1[n] to DM[n] 212 at Nth interval of the regular clock 236, the selection index signal used for generating the plurality of selection signals D1[n] to DM[n] 212 at the Nth interval, is dependent on the plurality of selection signals generated at (N−1)th interval of the regular clock 236.

The operation of the DAC 210 is explained now through the plurality of DAC elements 210a to 210m. The DAC element as illustrated in FIG. 2 is one of the many ways of implementing the DAC 210, and variations, and alternative constructions are apparent and well within the spirit and scope of the disclosure. Each DAC element of the plurality of DAC elements is same in connection and operation, and hence, functioning of DAC element 210a is only explained here for brevity of the description.

The DAC element 210a includes a first switch 242 coupled to the first input port A 202, and a second switch 244 coupled to the second input port B 204. The first switch 242 and the second switch 244 receive the differential input signal Im and Ip. A current source Io 246 is coupled between a ground terminal and the first switch 242 and the second switch 244. The first switch 242 is activated by the selection signal D1[n] 254. The second switch 244 is activated by the inverted selection signal $\overline{D1[n]}$ 252. The glitches in the DAC element 210a introduces dynamic error in the DAC. Each of the DAC element in the DAC 210 has dynamic error.

One of the reasons for dynamic error is mismatched components in the DAC element 210a. An error introduced in both positive and negative transition is not same. This results in error accumulation over a large number of transitions which cause non-linearity with DAC code. Also, it results in offset and harmonics with signal and low pass shaped noise in idle channel.

The first switch 242 and the second switch 244 receives the differential feedback signal 206a and 206b based on value of the selection signal D1[n]. Mismatch in the first switch 242 and the second switch 244 is illustrated as ΔV 260. Mismatch in the parasitic capacitance associated between the gate and source terminals of the first switch 242 and the second switch 244 is represented as ΔCgs 262. These mismatches along with an offset associated with the loop filter 214 results in dynamic error.

During a transition from logic 0 to logic 1, because of mismatch between the parasitic capacitance associated between the gate and source ΔCgs 262, a differential charge is injected from the second input port B 204 in the parasitic capacitance associated between the gate and source ΔCgs 262. During a transition from logic 1 to logic 0, because of mismatch between the parasitic capacitance associated between the gate and source ΔCgs 262, a differential charge is injected at the first input port A 202 from the parasitic capacitance ΔCgs 262. This results in the dynamic error in the DAC element 210a.

In case of rise or fall mismatch in the DAC 210 because of mismatch in a driver of DAC 210, a dynamic error is introduced. In addition, the dynamic error is also caused by the offset associated with the loop filter 214. During a transition of logic 0 to logic 1, a differential current is injected from the loop filter 214 to a parasitic capacitance Cp 264. During a transition from logic 1 to logic 0, a differential current is injected from the DAC element 210a in the loop filter 214.

Each DAC element in the DAC 210 suffers from these factors which causes dynamic error in the DAC 210 to accumulate. This limits the performance of the delta sigma modulator 200. However, the modified DWA block 240 is used to cancel the dynamic error in the delta sigma modulator 200, which is discussed in detail in connection with FIG. 3.

Figure 3:
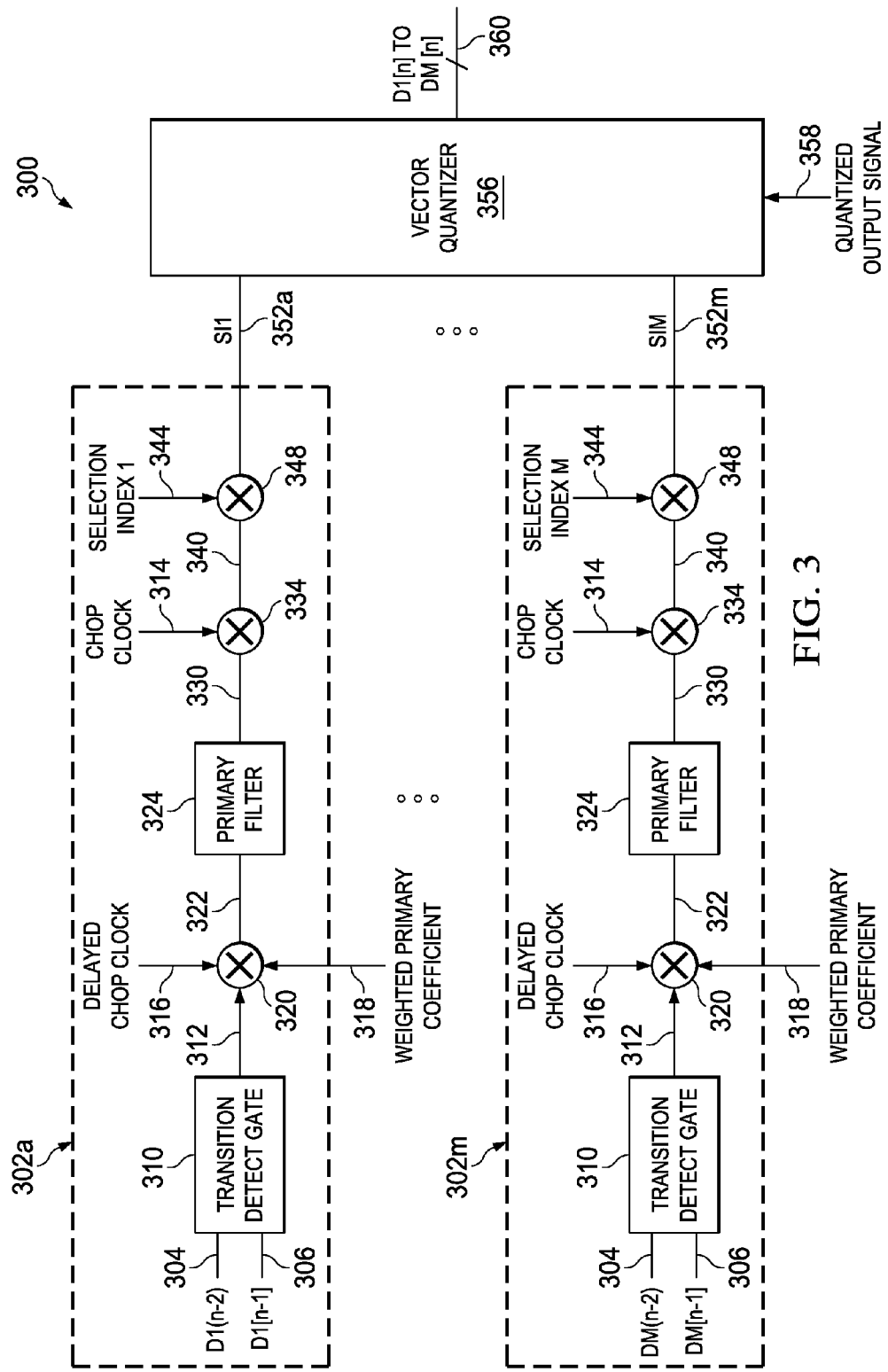
FIG. 3 illustrates a modified DWA block, according to an embodiment.

FIG. 3 illustrates a modified DWA block 300, according to an embodiment. In one example, the modified DWA block 300 is similar to the modified DWA block 140, illustrated in FIG. 1, in connection and operation. In another example, the modified DWA block 300 is similar to the modified DWA block 240, illustrated in FIG. 2, in connection and operation. In yet another example, the modified DWA block 300 is similar to the modified DWA block 640, illustrated in FIG. 6 later in this description, in connection and operation. The operation of the modified DWA block 300 is explained in connection with the delta sigma modulator 100.

The modified DWA block 300 receives a quantized output signal 358 from a quantizer similar to the quantized output signal 120 received by the modified DWA block 140 from the quantizer 118. The modified DWA block 300 generates a plurality of selection signals D1[n] to DM[n] 360 similar to the plurality of selection signals 112 generated by the modified DWA block 140.

The modified DWA block 300 includes a plurality of transition counters illustrated as 302a to 302m. Each transition counter of the plurality of transition counters 302a to 302m is similar in connection and operation. Hence, for brevity of the description, the transition counter 302a is explained here. The transition counter 302a includes a transition detect gate 310, a first multiplier 320, a primary filter 324, a second multiplier 334 and a third multiplier 348. The transition detect gate 310 receives a set of previously generated selection signals of the plurality of previously generated selection signals. When the plurality of selection signals is D1[n] to DM[n] 360, the set of previously generated selection signals, in one version, are represented as D1[n−1] 306 and D1[n−2] 304. In one example, the transition detect gate 310 is a XOR gate. In another example, the transition detect gate 310 is a combination of logic gates.

The first multiplier 320 is coupled to the transition detect gate 310. The first multiplier 320 receives a delayed chop clock 316 and a weighted primary coefficient 318. The delayed chop clock 316 is a delayed version of the chop clock 314. In one example, when the chop clock 314 is represented as C[n], the delayed chop clock 316 is represented as C[n−1]. The primary filter 324 is coupled to the first multiplier 320. The second multiplier 334 is coupled to the primary filter 324, and receives the chop clock 314. The third multiplier 348 is coupled to the second multiplier 334, and receives a selection index 1 signal 344 of a plurality of selection index signals illustrated as selection index 1 signal to selection index M signal. Each transition counter of the plurality of transition counters 302a to 302m also receives a regular clock (not illustrated in the FIG. 3). The transition counter 302a may include one or more additional components known to those skilled in the relevant art and are not discussed here for simplicity of the description.

The transition detect gate 310 generates a state signal 312 in response to the set of previously generated selection signals D1[n−1] 306 and D1[n−2] 304. If the selection signal D1[n] is generated at nth interval of the regular clock, the previously generated selection signal D1[n−1] 306 is generated at (n−1)th interval of the regular clock. In another example, the set of previously generated selection signals are generated at a previous state of the regular clock.

The first multiplier 320 multiplies the state signal 312, the delayed chop clock 316 and the weighted primary coefficient 318 to generate a first intermediate signal 322. In one version, the first multiplier 320 does not receive the weighted primary coefficient 318, and the first intermediate signal 322 is generated by multiplying the state signal 312 and the delayed chop clock 316. The weighted primary coefficient 318 at a defined state of regular clock is derived from a plurality of filter coefficients associated with a reset filter, for example, reset filter 124 illustrated in FIG. 1. The weighted primary coefficient 318 at a clock signal is derived from the plurality of filter coefficients.

The primary filter 324 filters the first intermediate signal 322 to generate a second intermediate signal 330. The second intermediate signal 330 is proportional to a number of transitions in a phase of the chop clock 314. In one example, the second intermediate signal is defined as:

$$\text{Second Intermediate Signal} = \pm(Npi - Nmi) \quad (1)$$

where, Npi is number of transitions in positive phase of the chop clock for $i^{th}$ DAC element, and Nmi is number of transitions in negative phase of the chop clock for $i^{th}$ DAC element.

The second multiplier 334 multiplies the second intermediate signal 330 and the chop clock 314 to generate a third intermediate signal 340. The third multiplier 348 multiplies the third intermediate signal 340 and the selection index 1 signal 344 of the plurality of selection index signals to generate an indexed signal SI1 352a. The selection index 1 signal 344 is dependent on previously generated plurality of selection signals. In one example, the selection index signal is defined as:

$$\text{Selection Index signal} = 1 - 2Di(n-1) \quad (2)$$

where, Di(n−1) is the selection signal received by $i^{th}$ DAC element at the (n−1)th interval of the regular clock. Each transition counter of the plurality of transition counters 302a to 302m generates the indexed signal illustrated as SI1 352a to SIM 352m.

The modified DWA block 300 includes a vector quantizer 356. The vector quantizer 356 generates the plurality of selection signals D1[n] to DM[n] 360 in response to the quantized output signal 358 and the indexed signals SI1 352a to SIM 352m.

The operation of the modified DWA block 300 is further explained in connection with Table 1. Here it is assumed that the modified DWA block 300 has two transition counters which receive the selection signal D1 and D2 respectively.

TABLE 1

|  | Nm switching | | | | Np switching | | | |
| --- | --- | --- | --- | --- | --- | --- | --- | --- |
| Regular clock | 1 | 2 | 3 | 4 | 5 | 6 | 7 | 8 |
| Chop clock | −1 | −1 | −1 | −1 | 1 | 1 | 1 | 1 |
| Quantized Output Signal | 1 | 2 | 1 | 1 | 0 | 1 | 1 | 1 |
| D1 | 1 | 1 | 1 | 1 | 0 | 0 | 1 | 1 |
| State signal1 | 0 | 1 | 0 | 0 | 0 | 1 | 0 | 1 |
| Np1 | 0 | 0 | 0 | 0 | 0 | 1 | 1 | 2 |
| Nm1 | 0 | 1 | 1 | 1 | 1 | 1 | 1 | 1 |
| Np1 − Nm1 | 0 | −1 | −1 | −1 | −1 | 0 | 0 | 1 |
| SI1 | 0 | 1 | 1 | 1 | −1 | 0 | 0 | 1 |
| D2 | 0 | 1 | 0 | 0 | 0 | 1 | 0 | 0 |
| State signal2 | 0 | 0 | 1 | 1 | 0 | 0 | 1 | 1 |
| Np2 | 0 | 0 | 0 | 0 | 0 | 0 | 1 | 2 |
| Nm2 | 0 | 0 | 1 | 2 | 2 | 2 | 2 | 2 |
| Np2 − Nm2 | 0 | 0 | −1 | −2 | −2 | −2 | −1 | 0 |
| SI2 | 0 | 0 | 1 | −2 | 2 | 2 | −1 | 0 |

The table 1 illustrates that the regular clock received by the delta sigma modulator 100 has multiple clock cycles. For the purpose of explanation, 8 clock cycles have been illustrated in the first row of the above table. 'Nm switching' represents negative phase of the chop clock i.e. when the chop clock is −1. 'Np switching' represents positive phase of the chop clock i.e. when the chop clock is 1. The quantized output signal 358 is received from the quantizer for example the quantizer 118 represented in FIG. 1.

The state signal1 or the state signal 2, in one example, represents XOR of D[n−1] and D[n−2]. The state signal also indicates if the selection signal has undergone a transition in previous two cycles. Np1 or Np2 represents a summation of transitions when the chop clock is 1. Nm1 and Nm2 represent a summation of transitions when the chop clock is −1. SI1 and SI2 are indexed signals. The indexed signals, in one example are represented as:

$$SIi=-(Npi-Nmi)*\text{Chop clock}*(1-2Di(n-1)) \quad (3)$$

Before initialization, the selection signals D1 and D2 are assumed to be 0. At clock cycle 1, the quantized output signal is 1. Hence, one selection signal has to be activated. Thus, the selection signal D1 is 1 and the selection signal D2 is 0. Np1 and Np2 will remain constant during Nm switching. Similarly, Nm1 and Nm2 will remain constant during Np switching.

At clock cycle 2, the quantized output signal is 2. Thus, both the selection signal D1 and D2 are 1. The state signal1 is 1 since the selection line has undergone a transition from 0 to 1. Since Nm1 is summation of transitions when the chop clock is −1, Nm1 during clock cycle 2 is 1.

At clock cycle 3, the quantized output signal is 1. Since, both SI1 and SI2 are 1, any of the selection signal D1 and D2 can be at 1. In the table 1, D1 is 1 and D2 is 0. The state signal1 is 0 as there is no transition in D1 in last two clock cycles. Nm1 remains 1. The state signal2 is 1 since the selection signal D2 has undergone a transition from 0 to 1 in clock cycle 2. Since Nm2 is summation of transitions when the chop clock is −1, Nm2 during clock cycle 3 becomes 1.

At clock cycle 4, the quantized output signal is 1. SI1 is 1 and SI2 is −2. Since SI1 is greater than SI2, the selection signal D1 is 1, and the selection signal D2 is 0. The state signal1 is 0 as there is no transition in D1 in the last two clock cycles. The state signal2 is 1 at the selection signal D2 has undergone a transition in the clock cycle 3. Nm2 becomes 2.

The clock cycles 5 to 8 are under Np switching. Nm1 and Nm2 will remain constant during Np switching.

At clock cycle 5, the quantized output signal is 0. Hence, both the selection signals D1 and D2 are at 0. The state signal1 remains at 0 since there is no transition in D1 in the last two clock cycles. The state signal2 is 0 since there is no transition in D2 in the last two clock cycles.

At clock cycle 6, the quantized output signal is 1. SI1 is 0 and SI2 is 2. Since SI2 is greater than SI1, D2 is at 1 and D1 is at 0. The state signal1 is at 1 since D1 has undergone a transition in the clock cycle 5. Since Np1 is summation of transitions when the chop clock is 1, Np1 during clock cycle 6 becomes 1. The state signal2 remains at 0 since there is no transition in D2 in the last two clock cycles. Np2 remains at 0.

At clock cycle 7, the quantized output signal is 1. SI1 is 0 and SI2 is −1. Thus, the selection signal D1 is 1 and the selection signal D2 is 0 since SI1 is greater than SI2. The state signal1 is 0 as there is no transition in D1 in last two clock cycles. Np1 remains at 1. The state signal2 is 1 since the selection signal D2 has undergone a transition from 0 to 1 in clock cycle 6. Since Np2 is summation of transitions when the chop clock is 1, Np2 during clock cycle 7 becomes 1.

At clock cycle 8, the quantized output signal is 1. SI1 is 1 and SI2 is 0. Thus, the selection signal D1 is 1 and the selection signal D2 is 0 since SI1 is greater than SI2. The state signal1 is 1 since D1 has undergone a transition in the clock cycle 7. Np1 becomes 2. The state signal2 is 1 since the selection signal D2 has undergone a transition from 1 to 0 in clock cycle 6. Since Np2 is summation of transitions when the chop clock is 1, Np2 during clock cycle 8 becomes 2.

The chop clock 314 has two phases, a positive phase and a negative phase. The modified DWA block 300 maintains that the DAC elements are activated in a predetermined order such that average transitions of all the DAC elements in the two phases of the chop clock 314 is equal. When the modified DWA block 300 is used in the delta sigma modulator 600, the chopping of a DAC element based on chop clock 314 leads to changing sign of dynamic error injected by the DAC element in the two phases of the chop clock 314. This ensures equal number of transitions of each DAC element in the two phases of the chop clock 314 which results in zero average dynamic error injected by the DAC element.

The modified DWA block 300 thus is effective in cancelling the dynamic error introduced in the delta sigma modulator 100. If a number of transitions of a DAC element in the DAC 110 is greater in a positive phase of the chop clock 314 than a number of transitions in negative phase of the chop clock 314, the modified DWA block 300 ensures that in next set of phases, the DAC element transitions lesser in the positive phase than the negative phase of the chop clock 314.

The modified DWA block 300 can efficiently determine the DAC elements which are to be activated in the DAC 110 based on the second intermediate signal 330 and the previously generated plurality of selection signals.

Figure 4:
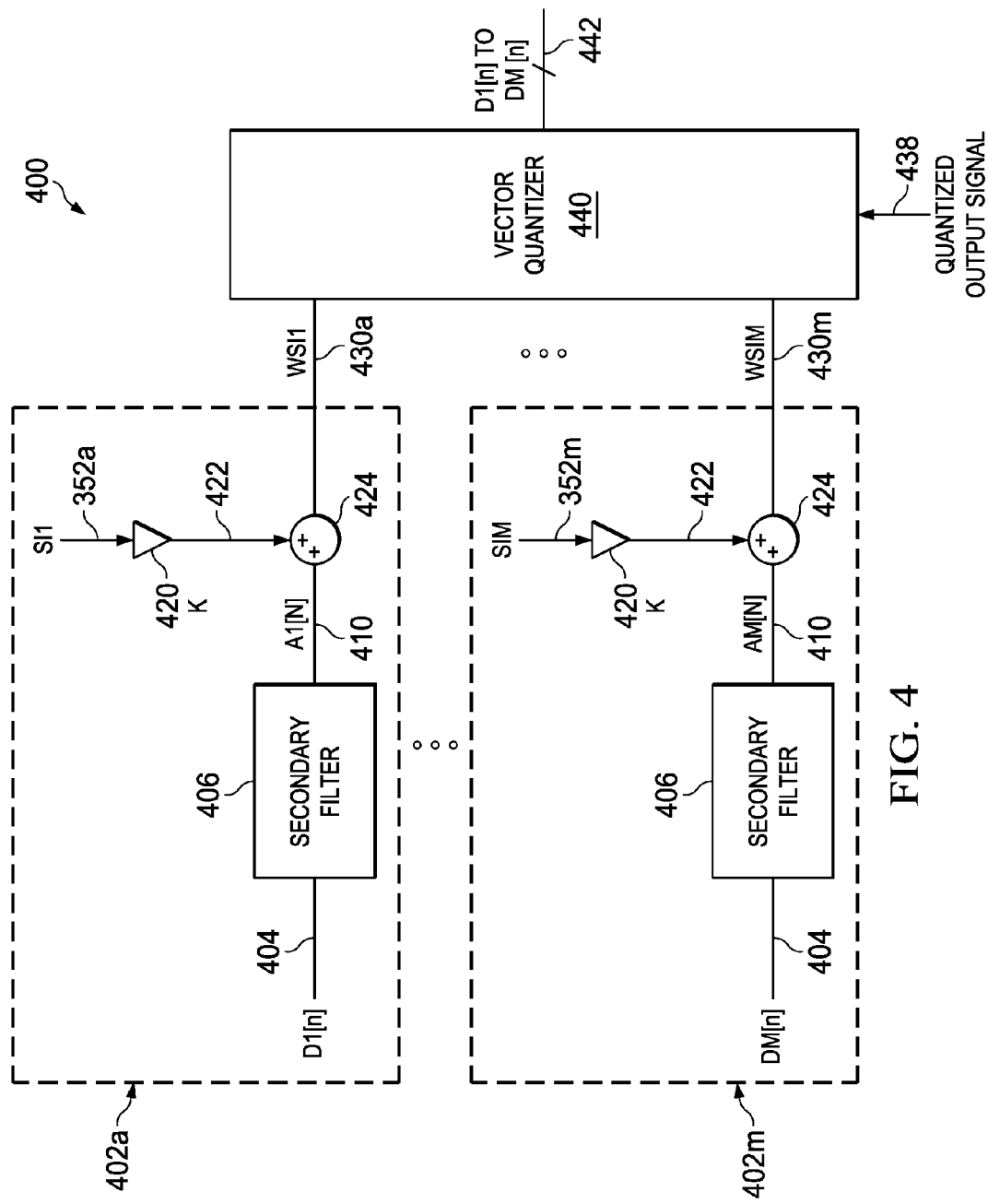
FIG. 4 illustrates a modified DWA block, according to another embodiment.

FIG. 4 illustrates a modified DWA block 400, according to another embodiment. In one example, the modified DWA block 400 is similar to the modified DWA block 140, illustrated in FIG. 1, in connection and operation. In another example, the modified DWA block 400 is similar to the modified DWA block 240, illustrated in FIG. 2, in connection and operation. The operation of the modified DWA block 400 is explained in connection with the delta sigma modulator 100.

The modified DWA block receives the indexed signals SI1 352*a* to SIM 352*m*. The generation of the indexed signals SI1 352*a* to SIM 352*m* is explained in connection with FIG. 3, and is not described here for brevity of the description. The modified DWA block 400 receives a quantized output signal 438 from a quantizer similar to the quantized output signal 120 received by the modified DWA block 140 from the quantizer 118. The modified DWA block 400 generates a plurality of selection signals D1[n] to DM[n] 442 similar to the plurality of selection signals 112 generated by the modified DWA block 140.

The modified DWA block 400 includes a plurality of transition counters illustrated as 402*a* to 402*m*. Each transition counter of the plurality of transition counters 402*a* to 402*m* is similar in connection and operation. Hence, for brevity of the description, the transition counter 402*a* is explained here. The transition counter 402*a* includes a secondary filter 406, a multiplier 420 and a summer 424. As discussed in connection with FIG. 3, the transition counter 402*a* can also include the blocks for generating the indexed signal SI1 352*a*. The blocks include the transition detect gate 310, the first multiplier 320, a primary filter 324, a second multiplier 334 and a third multiplier 348. These blocks are not explained here for sake of brevity of description.

The secondary filter 406 receives a selection signal D1[n] of the plurality of selection signals D1[n] to DM[n] 442. The multiplier 420 receives the indexed signal SI1 352*a*. The summer 424 is coupled to the secondary filter 406 and the multiplier 420. Each transition counter of the plurality of transition counters 402*a* to 402*m* also receives a regular clock (not illustrated in the FIG. 4). The transition counter 402*a* may include one or more additional components known to those skilled in the relevant art and are not discussed here for simplicity of the description.

The secondary filter 406 filters the selection signal D1[n] to generate a fourth intermediate signal A1[n] 410. The multiplier 420 multiplies the indexed signal SI1 352*a* and a weighted secondary coefficient K to generate a fifth intermediate signal 422. The summer 424 sums the fourth intermediate signal A1[n] 410 and the fifth intermediate signal 422 to generate a weighted indexed signal WSI1 430*a*.

Each transition counter of the plurality of transition counters 402*a* to 402*m* generates the weighted indexed signal illustrated as WSI1 430*a* to WSIM 430*m*. The modified DWA block 400 includes a vector quantizer 440. The vector quantizer 440 generates the plurality of selection signals D1[n] to DM[n] 442 in response to the quantized output signal 438 and the weighted indexed signals WSI1 430*a* to WSIM 430*m*.

The secondary filter 406 makes in-band contribution of the plurality of selection signals D1[n] to DM[n] same, thus cancelling mismatch among the DAC elements in the DAC for example DAC 110. The indexed signals SI1 352*a* to SIM 352*m* cancels dynamic error of each DAC element. The summing of the fourth intermediate signal A1[n] 410 and the fifth intermediate signal 422 is effective both in cancelling the dynamic error and in cancelling the mismatch among the DAC elements. The weighted secondary coefficient K is selected based on the importance of cancelling the dynamic error as comparted to the mismatch error in the DAC elements.

Figure 5:
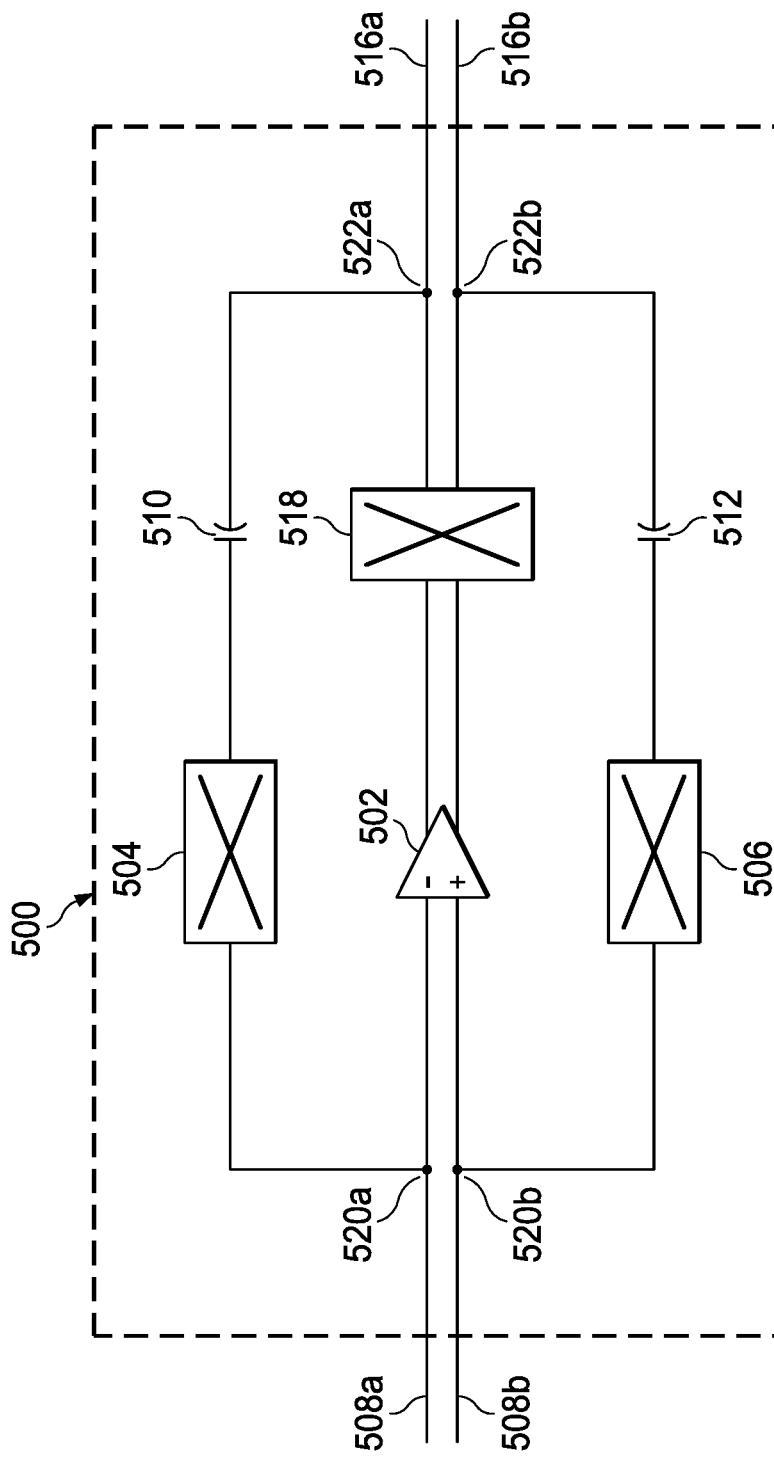
FIG. 5 illustrates a loop filter, according to an embodiment.

FIG. 5 illustrates a loop filter 500, according to an embodiment. In one example, the loop filter 500 is similar to the loop filter 114, illustrated in FIG. 1, in connection and operation. In another example, the loop filter 500 is similar to the loop filter 214, illustrated in FIG. 2, in connection and operation. The operation of the loop filter 500 is explained in connection with the delta sigma modulator 100.

The loop filter 500 includes an operational amplifier 502 having an inverting terminal 520*a* and a non-inverting terminal 520*b*. A first chopper 518 is coupled to the operational amplifier 502. The first chopper 518 has a first output terminal 522*a* and a second output terminal 522*b*. A second chopper 504 is coupled to the inverting terminal 520*a* of the operational amplifier 502. A third chopper 506 is coupled to the non-inverting terminal 520*b* of the operational amplifier 502. A first feedback capacitor 510 is coupled between the second chopper 504 and the first output terminal 522*a*. A second feedback capacitor 512 is coupled between the third chopper 506 and the second output terminal 522*b*.

The operational amplifier 502 receives a differential error signal illustrated as 508*a* and 508*b*. The differential error signal 508*a* and 508*b* is similar to the differential error signal 108*a* and 108*b* illustrated in FIG. 1. The operational amplifier 502 generates a differential output signal in response to the differential error signal 508*a* and 508*b*. The first chopper 518 generates a differential filtered signal 516*a* and 516*b*, at the first output terminal 522*a* and the second output terminal 522*b*, in response to the differential output signal. The differential filtered signal 516*a* and 516*b* is similar to the differential filtered signal 116*a* and 116*b* illustrated in FIG. 1.

Each of the first chopper 518, the second chopper 504 and the third chopper 506 operates at a chop clock similar to the chop clock 134 (illustrated in FIG. 1). The second chopper 504 and the third chopper 506 are used for discharging of the first feedback capacitor 510 and the second feedback capacitor 512 respectively. Thus, the second chopper 504 and the third chopper 506 maintain a state of the differential filtered signal 516*a* and 516*b* to a previous state. The first chopper 518 chops the differential output signal at a frequency of the chop clock to generate the differential filtered signal 516*a* and 516*b*.

Figure 6:
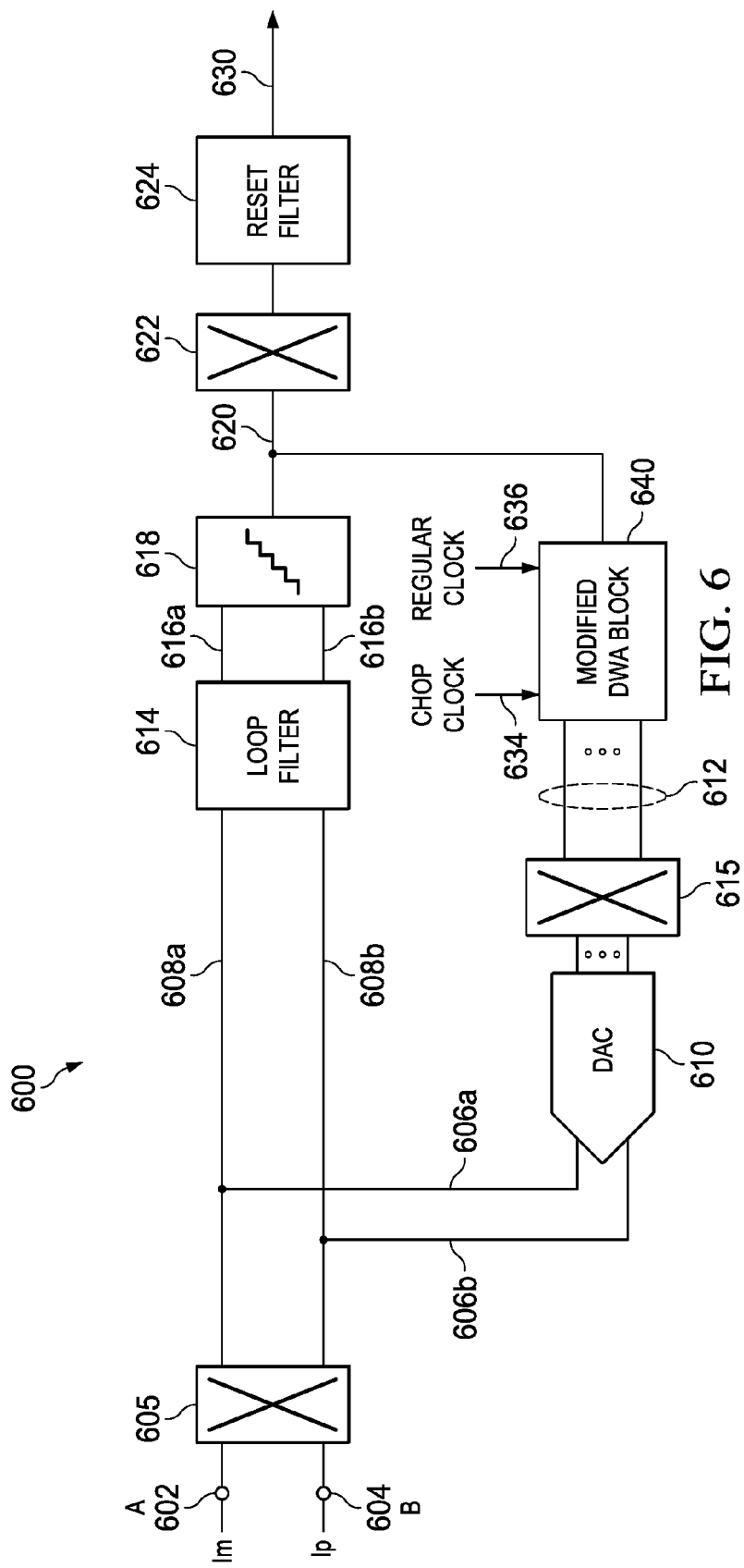
FIG. 6 is a block diagram of a delta sigma modulator, according to an embodiment.

FIG. 6 is a block diagram of a delta sigma modulator 600, according to an embodiment. The delta sigma modulator 600 includes a first input port A 602 and a second input port B 604. The delta sigma modulator 600 also includes a digital to analog converter (DAC) 610, a loop filter 614, a quantizer 618, a reset filter 624, a modified DWA block 640, a fourth chopper 605, a fifth chopper 615 and a sixth chopper 622. The first input port A 602 and the second input port B 604 receives a differential input signal illustrated as Im and Ip. The fourth chopper 605 is coupled to the first input port A 602 and the second input port B 604.

The DAC 610 is coupled to the first input port A 602 and the second input port B 604 and the fourth chopper 605. The loop filter 614 is coupled to the first input port A 602 and the second input port B 604 through the fourth chopper 605. The quantizer 618 is coupled to the loop filter 614. The sixth chopper 622 is coupled between the quantizer 618 and the reset filter 624. The reset filter 624 is coupled to the quantizer 618 through the sixth chopper 622. The fifth chopper 615 is coupled between the modified DWA block 640 and the DAC 610. The modified DWA block 640 is coupled to the quantizer 618. The modified DWA block 640 is coupled to the DAC 610 through the fifth chopper 615. The modified DWA block 640 receives a chop clock 634 and a regular clock 636. The delta sigma modulator 600 may include one or more additional components known to those skilled in the relevant art and are not discussed here for simplicity of the description.

The operation of the delta sigma modulator 600 illustrated in FIG. 6 is explained now. The differential input signal illustrated as Im and Ip is received at the first input port A 602 and the second input port B 604. The fourth chopper 605 chops the differential input signal Im and Ip. The fourth chopper 605 provides a differential feedback signal 606a and 606b to the DAC 610. The fourth chopper 605 also provides a differential error signal 608a and 608b to the loop filter 614. The DAC 160 receives the differential feedback signal 606a and 606b. The DAC 160 also receives a plurality of selection signals 612. The DAC 610 includes a plurality of DAC elements. Each DAC element of the plurality of DAC elements receives a selection signal of the plurality of selection signals 612. The loop filter 614 receives the differential error signal 608a and 608b. In one example, the differential error signal 608a and 608b is proportional to a difference in the differential input signal Im and Ip and the differential feedback signal 606a and 606b.

The loop filter 614 generates a differential filtered signal illustrated as 616a and 616b in response to a differential error signal 608a and 608b. The quantizer 618 generates a quantized output signal 620 in response to the differential filtered signal 616a and 616b. The sixth chopper 622 chops the quantized output signal 620, and after chopping, provides the quantized output signal 620 to the reset filter 624. A plurality of filter coefficients is associated with the reset filter 624. The reset filter 624 generates a digital output signal 630 in response to the quantized output signal 620 and the plurality of filter coefficients.

The modified data weighted averaging (DWA) block 640 generates the plurality of selection signals 612 in response to the chop clock 634, the regular clock 636, the quantized output signal 620 and a selection index signal of a plurality of selection index signals. The selection index signal is dependent on previously generated plurality of selection signals. The previously generated plurality of selection signals are generated in a previous state of the regular clock 636. In one example, when the modified DWA block 640 generates the plurality of selection signals 612 at Nth interval of the regular clock 636, the selection index signal, used for generating the plurality of selection signals 612 at the Nth interval, is dependent on the plurality of selection signals generated at (N−1)th interval of the regular clock 636.

The fifth chopper 615 chops the plurality of selection signals 612, and after chopping, provides the plurality of selection signals 612 to the DAC. Each of the fourth chopper 605, the fifth chopper 615 and the sixth chopper 622 operates at the chop clock 634. Each of the chopper in the delta sigma modulator 100 works in such a way that a dynamic error of the DAC 610 and a driver associated with the DAC 610 is getting flipped.

The chop clock has two phases, a positive phase and a negative phase. When the delta sigma modulator 600 is continuously running, the fourth chopper 605, the fifth chopper 615 and each chopper inside the loop filter 614 (as illustrated in connection with FIG. 5) are operational. This ensures that the differential input signal Ip and Im are connected to corresponding previous state stored in the first feedback capacitor 510 and the second feedback capacitor 512 (illustrated in FIG. 5) in the two phases of the chop clock 634. It also ensures that there is no sign reversal of the differential input signal Ip and Im till the first output terminal 522a and the second output terminal 522b (illustrated in FIG. 5). This ensures that a path of the differential input signal Ip and Im is not affected, and each DAC element of the plurality of DAC elements in the DAC 610 is chopped without extra series switch in the DAC 610.

Each DAC element of the plurality of DAC elements in the DAC 610 generates dynamic error. The dynamic error is positive and negative in two phase of chop clock 634 as there is reversal in each DAC element's path to output. Thus, the dynamic error is cancelled in the delta sigma modulator 600.

If the delta sigma modulator 600 is a reset sigma delta modulator, only the fourth chopper 605 and the sixth chopper 622 are functional. This ensures that an input transfer function for the delta sigma modulator 600 remains constant.

Figure 7:
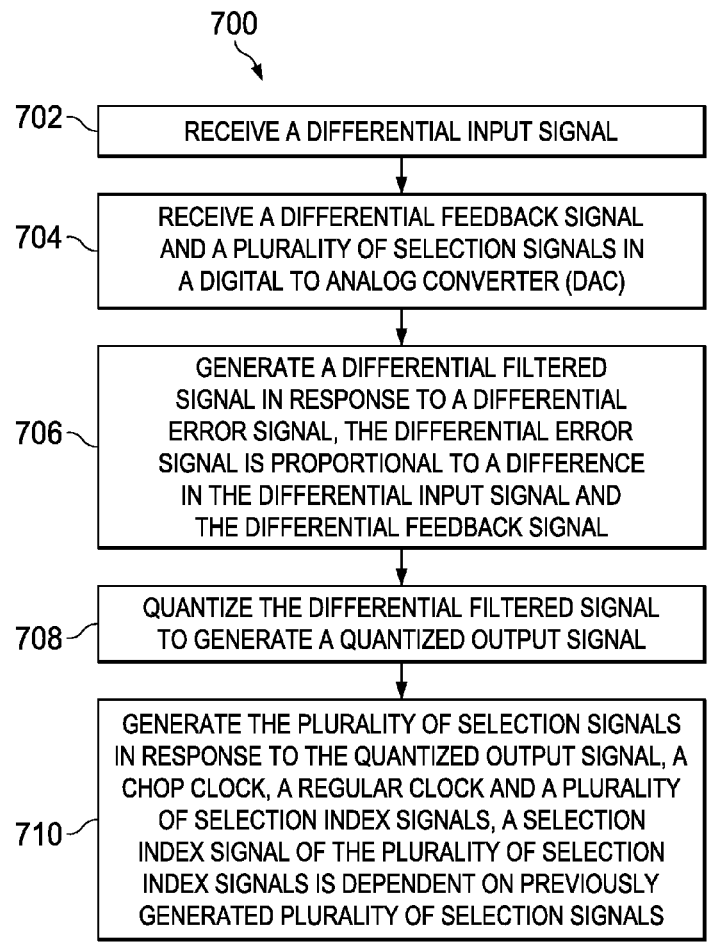
FIG. 7 is a flowchart to illustrate a method of operation of a delta sigma modulator, according to an embodiment.

FIG. 7 is a flowchart 700 to illustrate a method of operation of a delta sigma modulator, according to an embodiment. The flowchart 700 is explained in connection with the delta sigma modulator 100 and the modified DWA block 300. At step 702, a differential input signal is received. As illustrated in FIG. 1, the differential input signal illustrated as Im and Ip is received at the first input port A 102 and the second input port B 104 of the delta sigma modulator 100. At step 704, a digital to analog converter (DAC) receives a differential feedback signal and a plurality of selection signals.

For example, in the delta sigma modulator 100, the DAC 110 receives the differential feedback signal illustrated as 106a and 106b from the first input port A 102 and the second input port B 104. The DAC 110 also receives a plurality of selection signals 112. The DAC 110 includes a plurality of DAC elements. Each DAC element of the plurality of DAC elements receives a selection signal of the plurality of selection signals. A differential filtered signal is generated in response to a differential error signal, at step 706. The differential error signal is proportional to a difference in the differential input signal and the differential feedback signal.

At step 708, the differential filtered signal is quantized to generate a quantized output signal. In the delta sigma modulator 100, the quantizer 118 generates a quantized output signal 120 in response to the differential filtered signal 116a and 116b. At step 710, the plurality of selection signals is generated in response to the quantized output signal, a chop clock, a regular clock and a plurality of selection index signals. A selection index signal of the plurality of selection index signal is dependent on previously generated plurality of selection signals. As illustrated in FIG. 1, the modified data weighted averaging (DWA) block 140 generates the plurality of selection signals 112 in response to the chop clock 134, the regular clock 136, the quantized output signal 120 and a selection index signal of the plurality of selection index signals. The previously generated plurality of selection signals are generated in a previous state of the regular clock 136.

A digital output signal is generated in response to the quantized output signal and a plurality of filter coefficients. In the delta sigma modulator 100, a plurality of filter coefficients is associated with the reset filter 124. The reset filter 124 generates a digital output signal 130 in response to the quantized output signal 120 and the plurality of filter coefficients. The method of generating a selection signal of the plurality of selection signals is explained now.

A state signal is generated in response to a set of previously generated selection signal of the plurality of previously generated selection signals. The state signal, the chop clock and a weighted primary coefficient are multiplied to generate a first intermediate signal. A primary filter generates a second intermediate signal in response to the first intermediate signal.

For example, in the modified DWA block 300, the transition detect gate 310 generates a state signal 312 in response to the set of previously generated selection signals D1[n−1] 306 and D1[n−2] 304. The first multiplier 320 multiplies the state signal 312, the chop clock 314 and the weighted primary coefficient 318 to generate a first intermediate signal 322. In one version, the first multiplier 320 does not receive the weighted primary coefficient 318, and the first intermediate signal 322 is generated by multiplying the state signal 312 and the chop clock 314. The weighted primary coefficient at a defined state of regular clock is derived from a plurality of filter coefficient associated with a reset filter, for example, reset filter 124 illustrated in FIG. 1.

The primary filter 324 filters the first intermediate signal 322 to generate a second intermediate signal 330. The second intermediate signal 330 is proportional to a number of transitions in a phase of the chop clock 314.

The second intermediate signal and the chop clock are multiplied to generate a third intermediate signal. The third intermediate signal is multiplied with a selection index signal of the plurality of selection index signals to generate an indexed signal. The indexed signal and the quantized output signal are provided to a vector quantizer.

In the modified DWA block 300, the second multiplier 334 multiplies the second intermediate signal 330 and the chop clock 314 to generate a third intermediate signal 340. The third multiplier 348 multiplies the third intermediate signal 340 and the selection index 1 signal 344 to generate an indexed signal SI1 352*a*. The selection index 1 signal 344 is dependent on previously generated plurality of selection signals.

Each transition counter of the plurality of transition counters 302*a* to 302*m* generates the indexed signal illustrated as SI1 352*a* to SIM 352*m*. The modified DWA block 300 includes a vector quantizer 356. The vector quantizer 356 generates the plurality of selection signals D1[n] to DM[n] 360 in response to the quantized output signal 358 and the indexed signals SI1 352*a* to SIM 352*m*.

The method is effective in cancelling the dynamic error introduced in the delta sigma modulator 100. If a number of transitions of a DAC element in the DAC is greater in a positive phase of the chop clock than a number of transitions in negative phase of the chop clock, the process ensures that in next set of phases, the DAC element transitions lesser in the positive phase than the negative phase of the chop clock.

Figure 8:
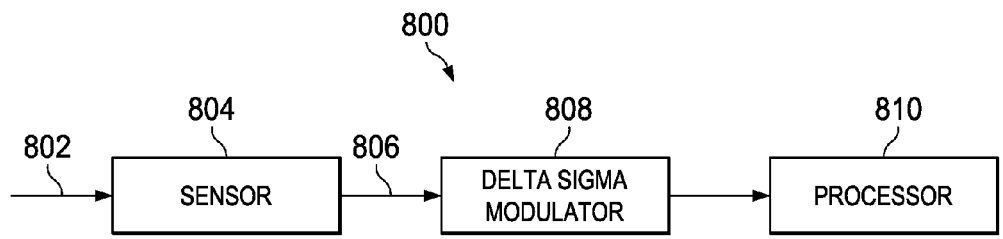
FIG. 8 is a block diagram of a device, according to an embodiment.

FIG. 8 is a block diagram of a device 800, according to an embodiment. The device 800 is, or is incorporated into, a computing device, a server, a transceiver, a communication device, or any other type of electronic system. The device 800 may include one or more additional components known to those skilled in the relevant art and are not discussed here for simplicity of the description.

The device 800 includes a sensor 804, a delta sigma modulator 808 and a processor 810. The sensor 804 receives a real-world signal 802. The real-world signal 802 can be at least one of the following, but not limited to, a vibration signal, a temperature signal, a pressure signal and the like. The sensor 804 generates a differential input signal 806 in response to the real-world signal 802. The delta sigma modulator 808 is coupled between the sensor 804 and the processor 810. The delta sigma modulator 808 generates a digital output signal in response to the differential input signal 806. The processor 810 processes the digital output signal.

The processor 810 can be, for example, a CISC-type (Complex Instruction Set Computer) CPU, RISC-type CPU (Reduced Instruction Set Computer), or a digital signal processor (DSP). The processor 810 can include a memory which can be memory such as RAM, flash memory, or disk storage. The delta sigma modulator 808 is similar to the delta sigma modulator 100 with the modified DWA block 300.

The modified DWA block 300 is effective in cancelling the dynamic error introduced in the delta sigma modulator 100. If a number of transitions of a DAC element in the DAC 110 is greater in a positive phase of the chop clock 314 than a number of transitions in negative phase of the chop clock 314, the modified DWA block 300 ensures that in next set of phases, the DAC element transitions lesser in the positive phase than the negative phase of the chop clock 314.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A delta sigma modulator comprising:
   a digital to analog converter (DAC) configured to receive a differential feedback signal and a plurality of selection signals; and
   a modified data weighted averaging (DWA) block coupled to the DAC, the modified DWA block comprising:
   a plurality of transition counters configured to generate a plurality of indexed signals in response to a plurality of selection index signals; and
   a vector quantizer coupled to the plurality of transition counters, and configured to generate the plurality of selection signals in response to the plurality of indexed signals and a quantized output signal.

2. The delta sigma modulator of claim 1, wherein the modified DWA block is configured to receive a chop clock and a regular clock, and wherein a selection index signal of the plurality of selection index signals is dependent on previously generated plurality of selections signals, and wherein the previously generated plurality of selection signals are generated in a previous state of the regular clock.

3. The delta sigma modulator of claim 1 further comprising:
   a first input port and a second input port, the first input port and the second input port configured to receive a differential input signal, the DAC is coupled to the first input port and the second input port;
   a loop filter coupled to the first input port and the second input port, and configured to generate a differential filtered signal in response to a differential error signal, the differential error signal is proportional to a difference in the differential input signal and the differential feedback signal;
   a quantizer coupled to the loop filter and configured to generate the quantized output signal in response to the differential filtered signal; and
   a reset filter coupled to the quantizer and configured to generate a digital output signal in response to the quantized output signal and a plurality of filter coefficients, wherein the DWA block is coupled between the quantizer and the DAC.

4. The delta sigma modulator of claim 1, wherein each transition counter of the plurality of transition counters comprising:

a transition detect gate configured to generate a state signal in response to a set of previously generated selection signals of the plurality of previously generated selection signals;

a first multiplier configured to multiply the state signal, a delayed chop clock, and a weighted primary coefficient to generate a first intermediate signal;

a primary filter coupled to the first multiplier, and configured to filter the first intermediate signal to generate a second intermediate signal;

a second multiplier configured to multiply the second intermediate signal and the chop clock to generate a third intermediate signal; and a third multiplier configured to multiply the third intermediate signal and a selection index signal of the plurality of selection index signals to generate an indexed signal of the plurality of indexed signals.

5. The delta sigma modulator of claim 4, wherein the second intermediate signal is proportional to a number of transitions in a phase of the chop clock, and the weighted primary coefficient at a defined state of regular clock is derived from the plurality of filter coefficients.

6. The delta sigma modulator of claim 4, wherein each transition counter further comprises:

a secondary filter configured to filter a selection signal of the plurality of selection signal to generate a fourth intermediate signal;

a multiplier configured to multiply the indexed signal and a weighted secondary coefficient to generate a fifth intermediate signal; and a summer coupled to the secondary filter, and configured to sum the fourth intermediate signal and the fifth intermediate signal to generate a weighted indexed signal.

7. The delta sigma modulator of claim 6, wherein the vector quantizer is configured to generate the plurality of selection signals in response to the weighted indexed signal received from each transition counter of the plurality of transition counters and the quantized output signal.

8. The delta sigma modulator of claim 1, wherein the DAC includes a plurality of DAC elements, at least one DAC element of the plurality of DAC elements comprises:

a first switch coupled to the first input port;

a second switch coupled to the second input port, the first switch and the second switch configured to receive the differential input signal; and a current source coupled between a ground terminal and the first switch and the second switch, wherein the first switch and the second switch configured to be activated by a selection signal of the plurality of selection signals, and an inverted selection signal respectively, and wherein a logic of the selection signal is inverted to generate the inverted selection signal.

9. The delta sigma modulator of claim 1, wherein the loop filter further comprises:

an operational amplifier having an inverting terminal and a non-inverting terminal, the operational amplifier configured to generate a differential output signal in response to the differential error signal;

a first chopper coupled to the operational amplifier, and configured to generate the differential filtered signal at a first output terminal and a second output terminal in response to the differential output signal;

a second chopper coupled to the inverting terminal of the operational amplifier;

a first feedback capacitor coupled between the second chopper and the first output terminal;

a third chopper coupled to the non-inverting terminal of the operational amplifier; and a second feedback capacitor coupled between the third chopper and the second output terminal.

10. The delta sigma modulator of claim 1 further comprising:

a fourth chopper coupled to the first input port and the second input port, and configured to chop the differential input signal, and after chopping, configured to provide the differential feedback signal to the DAC and to provide the differential error signal to the loop filter; and a fifth chopper coupled between the modified DWA block and the DAC, and configured to chop the plurality of selection signals, and after chopping, configured to provide the plurality of selection signals to the DAC.

11. The delta sigma modulator of claim 1 further comprising a sixth chopper coupled between the quantizer and the reset filter, the sixth chopper configured to chop the quantized output signal, and after chopping, configured to provide the quantized output signal to the reset filter.

12. The delta sigma modulator of claim 11, wherein the first chopper, the second chopper, the third chopper, the fourth chopper, the fifth chopper and the sixth chopper are configured to operate at the chop clock.

13. A method comprising:

receiving a differential feedback signal and a plurality of selection signals in a digital to analog converter (DAC);

generating a digital output signal in response to a quantized output signal and a plurality of filter coefficients generating a plurality of indexed signals in response to a plurality of selection index signals; and generating the plurality of selection signals in response to the plurality of indexed signals and the quantized output signal in a vector quantizer, wherein a selection index signal of the plurality of selection index signals is dependent on previously generated plurality of selection signals.

14. The method of claim 13 further comprising:

receiving a differential input signal;

generating a differential filtered signal in response to a differential error signal, the differential error signal is proportional to a difference in the differential input signal and the differential feedback signal; and quantizing the differential filtered signal to generate the quantized output signal, wherein the previously generated plurality of selection signals are generated in a previous state of a regular clock.

15. The method of claim 13, wherein generating a selection signal of the plurality of selection signals further comprises:

generating a state signal in response to a set of previously generated selection signal of the plurality of previously generated selection signals;

multiplying the state signal, a delayed chop clock, and a weighted primary coefficient to generate a first intermediate signal;

generating a second intermediate signal by a primary filter in response to the first intermediate signal;

multiplying the second intermediate signal and a chop clock to generate a third intermediate signal;

multiplying the third intermediate signal and a selection index signal of the plurality of selection index signals to generate an indexed signal; and providing the indexed signal and the quantized output signal to a vector quantizer.

16. The method of claim 15, wherein the second intermediate signal is proportional to a number of transitions in a phase of the chop clock, and the weighted primary coefficient at a clock signal is derived from the plurality of filter coefficients.

17. The method of claim 15 further comprising:
filtering the selection signal of the plurality of selection signals to generate a fourth intermediate signal;
multiplying the indexed signal and a weighted secondary coefficient to generate a fifth intermediate signal;
summing the fourth intermediate signal and the fifth intermediate signal to generate a weighted indexed signal; and
providing the weighted indexed signal and the quantized output signal to the vector quantizer.

18. A device comprising:
a sensor configured to generate a differential input signal in response to a real-world signal;
a processor coupled to the sensor and configured to process a digital output signal, and
a delta sigma modulator coupled between the sensor and the processor, and configured to generate the digital output signal, the delta sigma modulator comprising:
a first input port and a second input port, the first input port and the second input port configured to receive the differential input signal;
a digital to analog converter (DAC) coupled to the first input port and the second input port, and configured to receive a differential feedback signal and a plurality of selection signals;
a loop filter coupled to the first input port and the second input port, and configured to generate a differential filtered signal in response to a differential error signal, the differential error signal is proportional to a difference in the differential input signal and the differential feedback signal;
a quantizer coupled to the loop filter and configured to generate a quantized output signal in response to the differential filtered signal; and
a modified data weighted averaging (DWA) block coupled between the quantizer and the DAC, the modified DWA block configured to receive the quantized output signal and a plurality of selection index signals, and configured to generate the plurality of selection signals.

* * * * *